US006803319B2

United States Patent
Janos et al.

(10) Patent No.: US 6,803,319 B2
(45) Date of Patent: Oct. 12, 2004

(54) PROCESS FOR OPTICALLY ERASING CHARGE BUILDUP DURING FABRICATION OF AN INTEGRATED CIRCUIT

(75) Inventors: Alan C. Janos, Darnestown, MD (US); Anthony Sinnot, Damascus, MD (US); Ivan Berry, Ellicott City, MD (US); Kevin Stewart, Germantown, MD (US); Robert Douglas Mohondro, Sykesville, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/248,779

(22) Filed: Feb. 18, 2003

(65) Prior Publication Data

US 2003/0180976 A1 Sep. 25, 2003

Related U.S. Application Data

(63) Continuation of application No. 10/000,772, filed on Nov. 30, 2001, now Pat. No. 6,605,484.

(51) Int. Cl.[7] .......................................... H01L 21/302
(52) U.S. Cl. .................. 438/710; 438/708; 438/709; 438/711; 438/712; 257/314; 257/317; 257/323; 257/326

(58) Field of Search ........................ 257/314, 317, 257/323, 326; 438/708–725

(56) References Cited

U.S. PATENT DOCUMENTS

| 541,475 A | * | 7/1895 | Wood et al. ............... 313/484 |
| 4,179,627 A | | 12/1979 | Reitz |
| 4,885,047 A | | 12/1989 | Ury et al. |
| 5,117,312 A | | 5/1992 | Dolan |
| 5,401,991 A | | 3/1995 | Imura |
| 5,530,247 A | | 6/1996 | McIver et al. |
| 5,541,475 A | | 7/1996 | Wood et al. |
| 5,712,715 A | * | 1/1998 | Erdogan et al. ............... 359/8 |
| 5,760,438 A | * | 6/1998 | Sethi et al. ................. 257/317 |
| 6,207,989 B1 | | 3/2001 | Li et al. |
| 6,350,699 B1 | * | 2/2002 | Maa et al. .................. 438/720 |
| 6,406,924 B1 | * | 6/2002 | Grimbergen et al. .......... 438/9 |

* cited by examiner

*Primary Examiner*—Long Pham
*Assistant Examiner*—Wai-Sing Louie
(74) *Attorney, Agent, or Firm*—Cantor Colburn LLP

(57) ABSTRACT

A process for optically reducing charge build-up in an integrated circuit includes exposing the integrated circuit or portions thereof to a broadband radiation source. The process effectively reduces charge buildup that occurs in the manufacture of integrated circuits.

17 Claims, 3 Drawing Sheets

PROCESS FOR OPTICALLY ERASING CHARGE BUILDUP DURING FABRICATION OF AN INTEGRATED CIRCUIT

CROSS REFERENCE TO RELATED APPLICATIONS

This application is a continuation of, and claims priority to, U.S. patent application Ser. No. 10/000,772, which was filed on Nov. 30, 2001, now U.S. Pat. No. 6,605,484.

BACKGROUND OF THE INVENTION

This disclosure relates generally to a process and apparatus for fabricating an integrated circuit and, more particularly, to a process and apparatus for optically removing or reducing charge build-up that occurs during fabrication of integrated circuit devices.

A variety of integrated circuits employing non-volatile memory (NVM) arrays have been proposed or used in industry. Non-volatile memory arrays are generally based upon a floating gate technology. That is, a technology that generally refers to the transfer of a charge through an oxide or a dielectric layer into a conductive floating gate where it can be stored or removed. An example of a non-volatile memory array device employing floating gate technology is an erasable programmable read-only memory ("EPROM") device that is readable, erasable and writeable, i.e., programmable. An EPROM generally employs a floating gate field effect transistor, which has binary states depending on the presence or absence of charge on the floating gate. Data is stored in the non-volatile memory device by the storage of electrical charge, e.g., electrons, in the floating gate.

Numerous varieties of EPROMs are available. In the traditional and most basic form, EPROMs are programmed electrically and erased by exposure to ultraviolet light. These types of EPROMs are commonly referred to as ultraviolet erasable programmable read-only memories ("UVEPROM's"). UVEPROMs can be programmed by running a high current between a drain and a source of the UVEPROM transistor while applying a positive potential to the gate. The positive potential on the gate attracts energetic (i.e., hot) electrons from the drain-to-source channel current, where the electrons jump or inject into the floating gate and become trapped on the floating gate. UVEPROM's based on this technology are designed to have their charge optically erased. In this manner, stored charge can be removed by exposing the device to ultraviolet light whenever re-programming is necessary.

An exemplary UVEPROM is shown in FIG. 1. The device, generally designated 10, includes a source region 12, and a drain region 14, formed on an n-type substrate 16. A gate oxide film 18 is formed on the substrate surface over a channel defined between the source region 12 and the drain region 14. A floating gate electrode 20 composed of p-type polysilicon or the like is typically disposed above the gate oxide film 18. Since UVEPROMs are designed to have their charge optically erased, any charge buildup that occurs during the fabrication process can be removed by exposing the device to ultraviolet light during the fabrication process.

Another form of EPROM is the electrically erasable programmable read-only memory also referred to as "EEPROM" or "E2PROM". EEPROMs are often programmed and erased electrically by way of a phenomenon known as Fowler-Nordheim tunneling. These devices are not designed to be optically erased during operation. Consequently, dangerous charge buildup can occur during the fabrication of the integrated circuit.

Still another form of EPROM is a "Flash EPROM," which is programmed using hot electrons and erased using the Fowler-Nordheim tunneling phenomenon. Flash EPROMs can be erased in a "flash" or bulk mode in which all cells in an array or a portion of an array can be erased simultaneously using Fowler-Nordheim tunneling. Flash EPROMs are commonly referred to as "flash cells" or "flash devices." Similar to EEPROM devices, charge buildup that occurs during fabrication of the flash EPROM device is not designed to be optically erased. As shown in FIG. 2, an exemplary EEPROM or flash EPROM device generally includes an additional conductive gate layer 22 disposed above the floating gate 20.

During fabrication of an integrated circuit, it is well known that undesirable charge buildup occurs such as on the floating gate of an EPROM device, if applicable, and/or other areas of the integrated circuit. This charge buildup can lead to high voltages and cause electrical damage to the circuitry if the charge buildup is not removed or neutralized. Charge buildup can readily occur during one or more of the numerous processing steps common to fabricating the integrated circuit. For example, charge buildup can occur during an annealing process, during metal ashing or etching processes, after via and pad formation steps, and the like. Integrated circuits typically employ 3 to 5 conductive metal layers, which during fabrication includes about 5 to about 7 processing steps that can contribute to charge buildup. It is important to erase the charge buildup as the device is being fabricated.

Current manufacturing processes strive to erase the charge buildup that occurs during the manufacture of integrated circuits, especially with integrated circuits employing non-volatile memory devices such as the above noted EEPROM and Flash memories. The use of electrical probes can be used to provide a temporary connection to the circuits in order to impose the required voltages to effect erasure of the charge buildup. However, this method is time consuming and not practical for high volume production. Erasure times using electrical probes are typically greater than about ten minutes per wafer and depending on the particular circuit design can be greater than one hour per wafer.

Charge buildup has also been removed by exposing the integrated circuit to narrow-band radiation sources. Current charge-removal processes utilize a mercury electrode lamp that produces a narrow-band spectrum at a wavelength of about 254 nanometers. The mercury lamp emits high-energy photons that propagate through the integrated circuit stack to impart energy to the stored electrons and other charges present. These energized electrons overcome the energy barriers that previously confined the electrons and other charges such that recombination can occur between the electrons and the electron holes or positive charges within the integrated circuit. The narrow-band UV light exposure also increases the mobility of charges on other areas of the integrated circuit.

In UVEPROMs, removal of charge buildup by exposure to narrow-band radiation sources is generally considered efficient since this type of device is originally configured for optical erasure during its operation. The oxide layers or dielectric layers disposed over the floating gate are transparent to the narrow-band radiation emitted by the mercury lamp at the wavelength of about 254 nm.

However, current processes employing narrow-band light sources are inefficient for removal of charge buildup in other types of integrated circuit devices such as those devices including a conductive (e.g., metal) gate layer disposed over the floating gate electrode (e.g., EEPROM, Flash memory and the like), or those including many layers of metal lines above the floating gate memory cell. As shown in FIG. 2, the presence of conductive gate layer 22 serves to block incident radiation from reaching the underlying floating gate electrode 20, greatly reducing its erase efficiency. As a result, current exposure tools require long exposure times (i.e., greater than about one or two hours per wafer depending on the particular IC design) to reduce the charge build-up.

Exposure times are directly dependent on the intensity of the light source (as well as other factors). Source intensities of the current-art light sources employed in exposure tools are limited to, for example, about 30 milliwatts per square centimeter ($mW/cm^2$) on average, and up to about 60 $mW/cm^2$ when the lamps are new. Moreover, the narrowband light sources utilized produce an emission signal comprising discrete and narrow spectral lines with low total output intensity at each line. Although the spectral output of prior art light sources can be varied to some extent, the resulting spectral lines do not contain much power or light intensity output apart from the primary emission at about 254 nm.

Current light sources employed for reducing charge buildup rely on bulb technology that includes the use of internal electrodes. The intensity of bulbs utilizing internal electrodes is known to deteriorate significantly over the usable life of the bulb. Users often allow the intensities to drop to as low as 50% of the intensity (compared to new) before replacing the bulbs in order to minimize the replacement expense. As a result, a decrease in throughput occurs as the bulb progressively deteriorates over time. Other problems resulting from the use of prior art bulbs include long cool down times for the lamps (up to several hours) such that replacement of the bulb often requires significant downtime to allow the bulb to cool. In addition, these types of bulbs exhibit a high failure rate upon re-ignition after the lamp is turned off. As a result, many integrated circuit manufacturers typically do not turn the bulbs off during periods of non-use, which drastically affects the useable operating lifetimes for the bulbs as well as increasing operating costs.

In addition to the inefficiencies of utilizing prior art light sources, current exposure tools have a relatively large footprint that requires a significant amount of floor space. Moreover, the exposure tools typically require manual loading of the wafers into the tool. This process is oftentimes today the only remaining step in a fab that requires manual handling. Manual handling is a serious disadvantage since it allows the possibility of wafer breakage or wafer damage (e.g., scratches), it requires additional labor investment, it allows for possible wafer contamination, and it does not easily provide for automatic wafer tracking.

There is clearly a need for an improved process for reducing charge build-up during the manufacture of integrated circuits, and especially with those integrated circuits utilizing non-volatile memory devices. Advanced design rules are further shrinking the patterns used for fabricating the integrated circuit. Concurrently, more metal line layers are being added, with the metal lines closer together since the minimum line and space dimensions also shrink. The net result is that it becomes more difficult for light of a given narrow-band wavelength to penetrate the IC structure and erase the charge buildup that occurs during the fabrication process.

SUMMARY OF THE INVENTION

Disclosed herein are processes and an apparatus for removing charge buildup that occurs during the manufacture of integrated circuits. In one embodiment, the apparatus comprises a radiation chamber comprising a light source and a reflector, wherein the light source is adapted to emit a broadband radiation pattern comprising wavelengths of about 180 nm to about 280 nm; a process chamber comprising a support, a gas inlet in gaseous communication with an inert gas, and a gas outlet; and a plate intermediate to the radiation chamber and the process chamber, wherein the plate is transmissive to the wavelengths of about 180 nm to about 280 nm.

In another embodiment, the apparatus comprises a radiation chamber comprising an electrodeless microwave driven bulb, wherein the electrodeless microwave driven bulb emits a broadband radiation pattern comprising wavelengths of about 180 nm to about 280 nm, wherein the wavelengths have at least one peak wavelength with a FWHM greater than about 10 nanometers; a process chamber comprising a support, a gas inlet in gaseous communication with an inert gas, and a gas outlet; and a plate intermediate the radiation chamber and the process chamber, wherein the plate is transmissive to the wavelengths of about 180 nm to about 280 nm.

In yet another embodiment, the apparatus comprises a radiation chamber comprising an electrodeless microwave driven bulb, wherein the electrodeless microwave driven bulb emits a broadband radiation pattern having a gaussian shape from about 190 nm to about 240 nm; a process chamber comprising a support, a gas inlet in gaseous communication with an inert gas, and a gas outlet; and a plate intermediate the radiation chamber and the process chamber, wherein the plate is transmissive to the broadband radiation pattern.

The above described and other features are exemplified by the following figures and detailed description.

BRIEF DESCRIPTION OF THE DRAWINGS

Referring now to the figures wherein the like elements are numbered alike.

DETAILED DESCRIPTION

A process for reducing charge build-up during fabrication of an integrated circuit comprises exposing the integrated circuit to a broadband radiation source at intensity and for an exposure time effective to reduce the charge buildup. In a preferred embodiment, the process is utilized during the manufacture of integrated circuits employing non-volatile memory devices. The process may be practiced during various stages of the fabrication process and is preferably implemented during those process steps known to contribute to charge buildup such as after plasma ashing or etching processes, annealing processes, after via and pad formation steps, and the like. The process is preferably employed after formation of at least one conductive layer.

While not wanting to be bound by theory, certain processes such as those described above are known to contribute to charge buildup. For illustrative purposes, patterning a conductive metal layer typically includes a plasma mediated etching process, wherein a gas mixture is exposed to an energy source and broken down to generate a plasma. The plasma contains reactive species that include energetic atoms, radicals, ions, electrons and photons. These species, depending on their concentration and energy levels, can cause charge buildup at various levels within the integrated circuit.

As used herein, the term "broadband" radiation source refers to a radiation source having at least one wavelength band having a full-width half-maximum greater than about 10 nanometers (nm), with preferably greater than about 15 nm more preferred, and with greater than 20 nm even more preferred. The term full-width half-maximum (FWHM) is hereinafter defined as the width across a wavelength profile when it drops to half of its peak, or maximum value.

Figure 1:
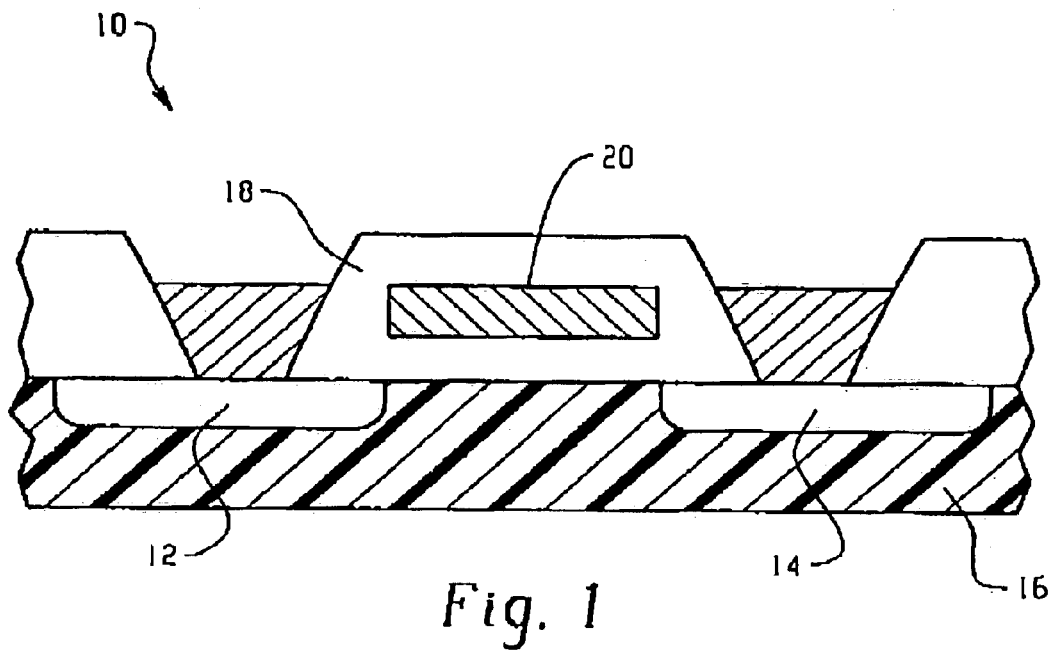
FIG. 1 illustrates a prior art UVEPROM device.
Figure 2:
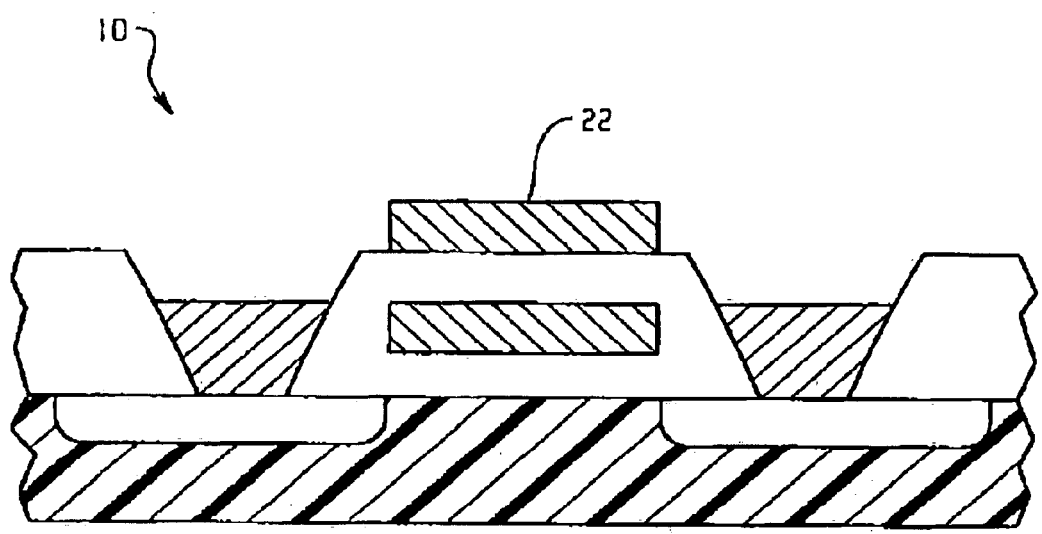
FIG. 2 illustrates a prior art EEPROM device.
Figure 3:
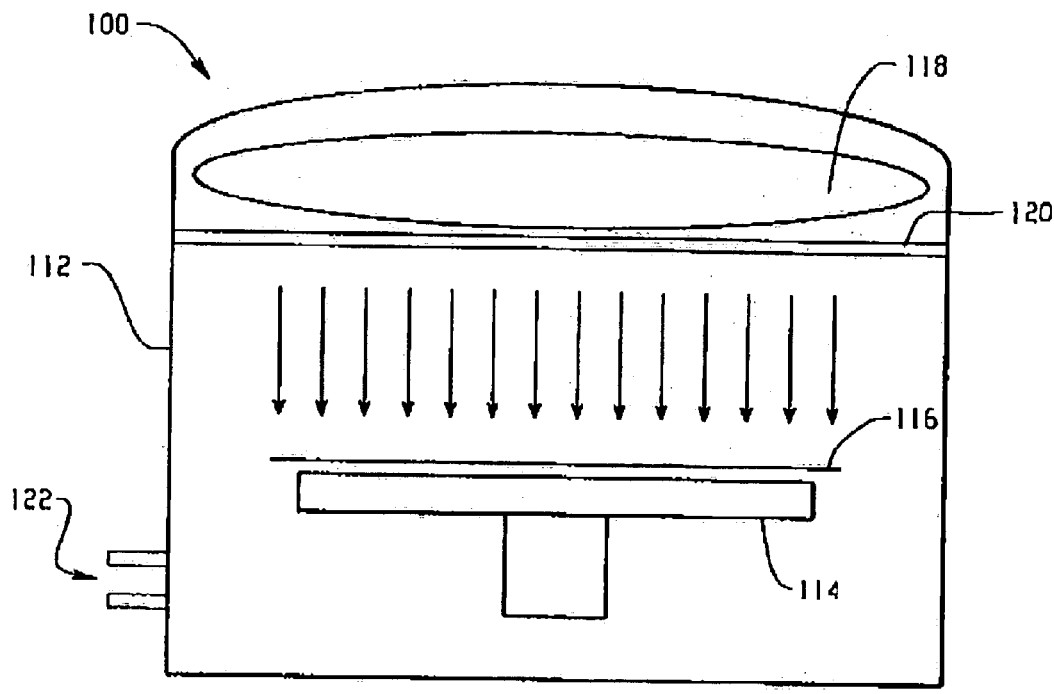
FIG. 3 illustrates an exemplary exposure tool for erasing charge buildup during the fabrication of an integrated circuit.

FIG. 3 illustrates an exemplary exposure tool 100 suitable for reducing charge build-up during the manufacture of an integrated circuit. The exposure tool 100 generally includes a process chamber 112 and a radiation source chamber 113. The process chamber 112 includes a chuck 114 on which a wafer 116 is disposed. Optionally, the chuck 114 or process chamber 112 may be adapted to provide a heat source (not shown) for heating the wafer during processing. An example of optional heating is a heated chuck. The exposure tool 100 further includes a radiation source 118 and a plate 120 disposed between the radiation source 118 and the chuck 114. Conduits 122 are disposed in fluid communication with the process chamber 112 for purging the chamber 112, regulating a pressure within the process chamber 112 and the like. The exposure tool 100 may further include additional features such as the structural features described in U.S. Pat. No. 4,885,047 to Matthews et al., incorporated herein by reference in its entirety, for providing a uniform exposure of light to the wafer surface. A uniform exposure of light to the wafer surface will reduce the need for overexposure to insure reduction of charge build-up in all areas of the wafer having non-volatile memory arrays, thus increasing throughput.

The plate 120 serves to isolate the radiation source 118 from the wafer 116 undergoing processing. Advantageously, the use of the plate 120 eliminates particulate contamination from the radiation source 118 to the wafer 116, isolates the radiation source 118 from the process chamber 112 to permit separate access, and, additionally, permits the use of gases to cool the radiation source and microwave cavity (not shown), if present. The plate also allows specially chosen process gases to be used in the process chamber without interfering with the operation of the light source. In this manner, conduits may be disposed in fluid communication with the radiation source chamber 113 and a process chamber 112 for purging the absorbing atmospheres contained therein as discussed in further detail below.

The plate 120 is preferably made of a substance that does not degrade in the operating environment. Preferably, the plate 120 is fabricated from quartz having an optical transmittance substantially transparent to the desired radiation for reducing charge buildup. It may be possible to use materials other than quartz, so long as the materials possess the above characteristics. For example, it may be preferred to expose the wafer to radiation having wavelengths below 220 nm for charge erasure. An example of such a quartz material is commercially available under the trade name Dynasil 1000 from the Dynasil Corporation in West Berlin, N.J. The plate 120 is mounted by conventional mounting means in the process chamber 112, which may include suitable spacers. Preferably, plate 120 and chuck 114 are in the shape of circular discs, so as to be congruent with the shape of the wafer 116 being processed. The radiation source 118 preferably emits a broadband radiation pattern having at least one wavelength less than about 280 nm, with about 180 nm to about 280 nm more preferred, and with about 180 nm to about 250 nm even more preferred. At least one of the preferred wavelengths has a FWHM greater than about 10 nm, with greater than 20 nm more preferred.

Figure 4:
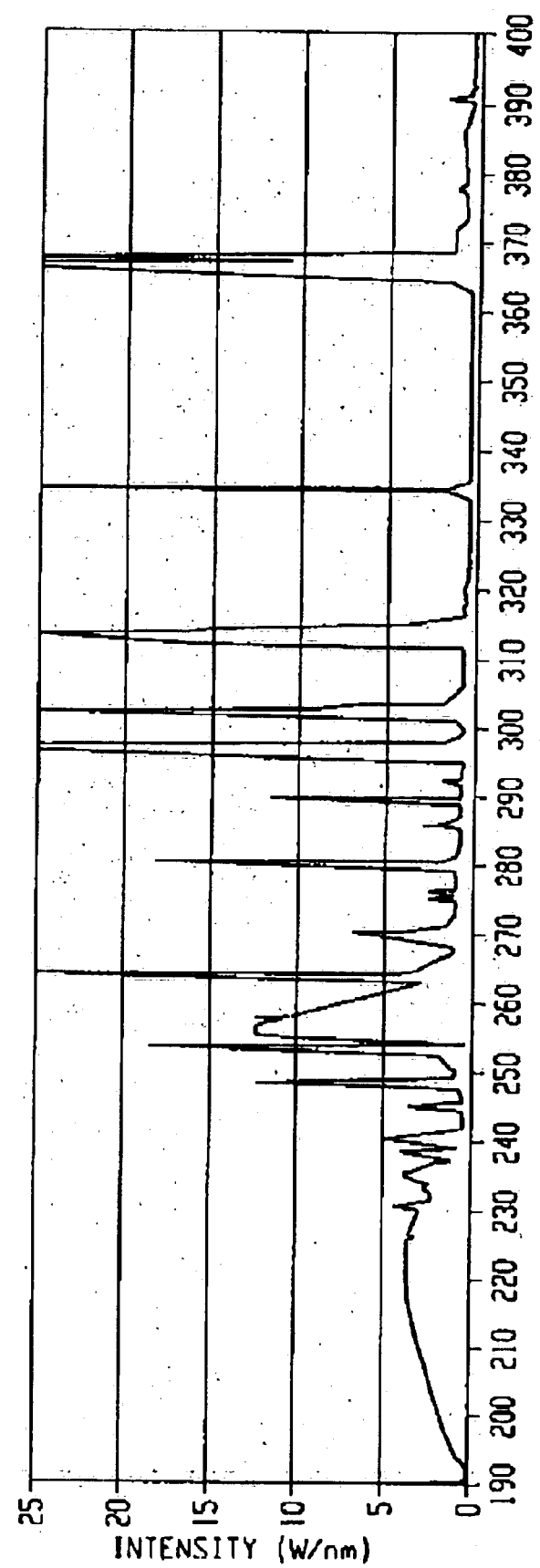
FIG. 4 graphically illustrates the broadband spectral output of an electrodeless microwave driven bulb used for charge erasure.

In a preferred embodiment, the radiation source 118 utilizes a microwave driven electrodeless bulb and a segmented reflector to provide a substantially uniform broadband radiation pattern on the wafer. Suitable microwave driven electrodeless bulbs are disclosed in U.S. Pat. No. 5,541,475 to Wood et al. An exemplary microwave driven electrodeless bulb that has been found to perform particularly well is commercially available under the trade name, HL Bulb, Part Number 203662, by the Axcelis Technologies, Inc. in Rockville, Md. A spectrum produced by this broadband ultraviolet radiation source is shown in FIG. 4, and it is noted that significant spectral components below 280 nm are present.

The process includes loading the wafer 116 into the process chamber 12 and exposing the wafer 116 to a broadband radiation pattern emitted by the radiation source 118. Preferably, the process chamber 112 is configured for automatic wafer handling such that manual handling of the wafer 116 is eliminated. In a preferred embodiment, the process includes purging the process chamber 112 with one or more inert gases to remove the air within the process chamber 112 and then exposing the wafer 116 to the broadband radiation pattern. Suitable inert gases for purging air from the process chamber 112 include, but are not limited to, nitrogen, argon, helium, combinations comprising at least one of the foregoing gases, and the like.

Air includes about 21% oxygen. It is generally known that oxygen absorbs radiation at wavelengths less than about 200 nm and reacts to form, among other products, ozone. The production of ozone, in turn, exacerbates wavelength absorption since ozone starts absorbing as high as 250 nm and continues to lower wavelengths. As a result, the process efficiency decreases. Purging the process chamber 112 and radiation source chamber 113 prior to exposing the wafer 116 to the broadband radiation pattern reduces wavelength absorption and as a result, increases the process efficiency.

Exposing the integrated circuit to the broadband radiation has numerous advantages. For example, constructive and destructive interference effects are minimized. Interference results if the film thicknesses of individual layers within the integrated circuit are an integer or a half-integer multiple of the wavelength and can cause too much or too little illumination passing through to lower levels. For narrow-band radiation sources employing a single wavelength, the interference effects can severely limit and reduce its efficiency for reducing charge buildup. In contrast, the interference effects from broadband radiation are minimal since it employs a broadband radiation pattern comprising a plurality of wavelengths that are unaffected by the interference, i.e., non-destructive or non-constructive with the given film thicknesses. Moreover, the use of broadband radiation assures that, for the various sized features, at least some of the various wavelengths in the broadband radiation pattern will refract around the features (avoiding shadows) and penetrate to the bottom of the stack where the memory arrays are typically disposed. In addition, it has been found that by exposing the wafer to shorter wavelengths, i.e., less than 280 nm, the efficiency of the process increases significantly. Shorter wavelengths have higher photon energy than longer wavelengths and, thus, are able to impart more energy to the charges, thus allowing the charges (e.g:, electrons) to more efficiently overcome the energy barriers characteristic of the charge build-up.

EXAMPLE 1

In this example, wafers were exposed to a broadband radiation pattern produced from a FUSION PS3 exposure tool. The exposure tool was fitted with an HL Bulb and produced the spectral pattern shown in FIG. 4. The FUSION PS3 exposure tool is commercially available from Axcelis Technologies, Inc. in Rockville, Md. Each wafer included several die that contained non-volatile memory (NVM, or Flash) structures preprogrammed to a charged state with an electrical probe. The non-volatile memory structures included a conductive gate disposed over a floating gate electrode based on 250 nm design rules. The electrical power to the magnetrons in the microwave circuit was 4500 watts (W) with transmission efficiency down the microwave circuit to the bulb of about 67% (i.e., approximately 3000 watts to the bulb).

Figure 5:
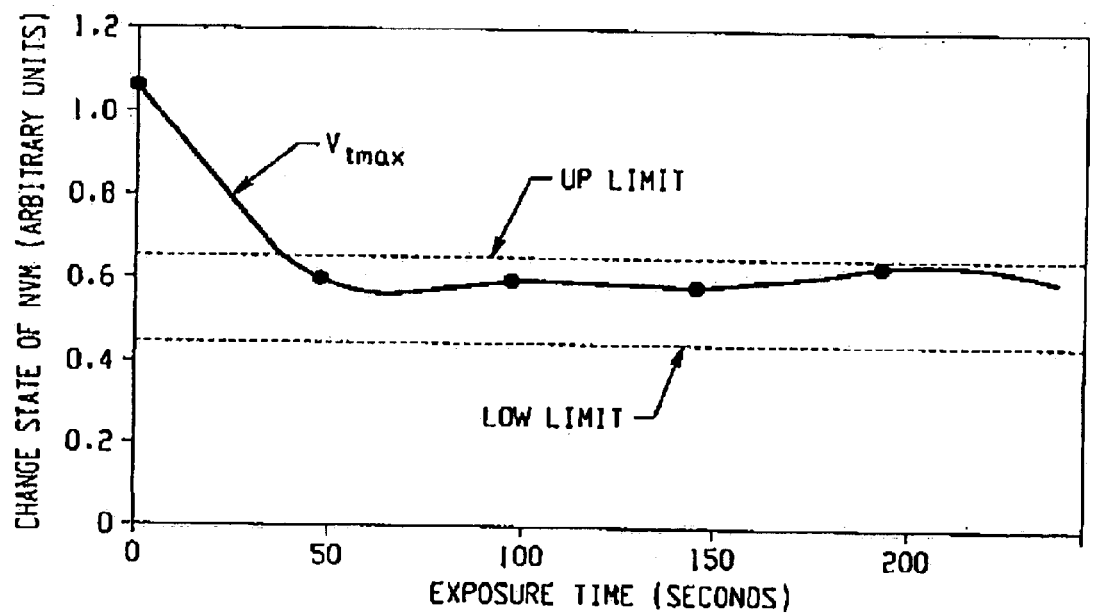
FIG. 5 graphically illustrates stored charge in an EEPROM device as a function of exposure time to a broadband radiation source.

Exposure times were varied for different sets of wafers and the charge on the gates were plotted as a function of time. The voltages, due to the stored charge, were normalized for the programmed state to a value of "one". The acceptable limits were predetermined as a percentage of the normalized programmed state in accordance with a manufacturer's specification for an acceptable "erased" state and were defined by the upper horizontal dashed line as shown in FIG. 5. FIG. 5 illustrates the charge state of the non-volatile memory structure as a function of exposure time to the broadband radiation source.

The results clearly show that a reduction in the stored charge to an acceptable level occurred in less than one minute for the non-volatile memory structures, representing a significant commercial advantage in terms of throughput and charge buildup reduction efficiencies. The process window is robust as shown from the prolonged exposure and its effect on maintaining the reduction of charge build-up within the acceptable limits. That is, over-exposure or over-erasing is not a problem. It should be noted that the charged state could not be entirely removed optically from the floating gate. Reducing the charge buildup to zero requires an electrical input such as with an electrical probe or the like. However, such low voltage level charged states (upper limit as shown in FIG. 5) is acceptable as an "erased state", or more specifically as a "UV-erased state" as opposed to "electrically erased states." As previously discussed, the use of electrical probes to reduce charge buildup is too time consuming and impractical to implement in production.

While the invention has been described with reference to an exemplary embodiment, it will be understood by those skilled in the art that various changes may be made and equivalents may be substituted for elements thereof without departing from the scope of the invention. For example, while an EEPROM array is illustrated and described, the disclosure applies with equal relevance to other non-volatile memory arrays in which the cells employ floating gates, and applies even to non-memory integrated circuits or non-memory portions of integrated circuits. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. An apparatus for erasing charge buildup that occurs during fabrication of an integrated circuit, the apparatus comprising:
    a radiation chamber comprising a light source, wherein the light source is adapted to omit a broadband radiation pattern comprising wavelengths of about 180 nm to about 280 nm;
    a process chamber comprising a support, a gas inlet in gaseous communication with an inert gas, and a gas outlet; and
    a plate intermediate to the radiation chamber and the process chamber, wherein the plate is transmissive to the broadband radiation pattern comprising the wavelengths of about 180 nm to about 280 nm.

2. The apparatus of claim 1, wherein the integrated circuit includes a floating gate structure.

3. The apparatus of claim 1, wherein the broadband radiation pattern comprises at least one wavelength less than about 280 nanometers with a FWHM greater than about 10 nanometers.

4. The apparatus of claim 1, wherein the broadband radiation pattern comprises at least one wavelength less than about 280 nanometers with a FWHM greater than about 20 nanometers.

5. The apparatus of claim 1, wherein the broadband radiation pattern comprises at least one wavelength of about 180 nanometers to about 280 nanometers with a FWHM greater than about 10 nanometers.

6. The apparatus of claim 1, wherein the broadband radiation pattern comprises at least one wavelength of about 180 nanometers to about 250 nanometers with a FWHM greater than about 20 nanometers.

7. The apparatus of claim 1, wherein the light source comprises a microwave driven electrodeless bulb.

8. The apparatus of claim 1, wherein the inert gas is selected from the group consisting of nitrogen, helium, argon, and combinations comprising at least one of the foregoing gases.

9. The apparatus of claim 1, wherein the support or the process chamber is adapted to increase a temperature of the substrate during processing.

10. The apparatus of claim 1, wherein the plate is fabricated from quartz.

11. The apparatus of claim 1, wherein the process chamber is free of air.

12. An apparatus for erasing charge buildup that occurs during fabrication of an integrated circuit, the apparatus comprising:
    a radiation chamber comprising an electrodeless microwave driven bulb, wherein the electrodeless microwave driven bulb emits a broadband radiation pattern comprising wavelengths of about 180 nm to about 280 nm, wherein the wavelengths have at least one peak wavelength with a FWHM greater than about 10 nanometers;
    a process chamber comprising a support, a gas inlet in gaseous communication with an inert gas, and a gas outlet; and
    a plate intermediate the radiation chamber and the process chamber, wherein the plate is transmissive to the wavelengths of about 180 nm to about 280 nm.

13. The apparatus of claim 12, wherein the FWHM is greater than 20 nanometers.

14. The apparatus of claim 12, wherein the broadband radiation pattern comprises at least one wavelength of about 180 nanometers to about 250 nanometers with a FWHM greater than 20 nanometers.

15. An apparatus for erasing charge buildup that occurs during fabrication of an integrated circuit, the apparatus comprising:
    a radiation chamber comprising an electrodeless microwave driven bulb, wherein the electrodeless microwave driven bulb emits a broadband radiation pattern having a gaussian shape from about 190 nm to about 240 nm;
    a process chamber comprising a support, a gas inlet in gaseous communication with an inert gas, and a gas outlet; and
    a plate intermediate to the radiation chamber and the process chamber, wherein the plate is transmissive to the broadband radiation pattern.

16. The apparatus of claim 15, wherein the FWHM is greater than 20 nanometers.

17. The apparatus of claim 15, wherein the broadband radiation pattern comprises at least one wavelength of about 180 nanometers to about 250 nanometers with a FWHM greater than 20 nanometers.

* * * * *